United States Patent
De Jager et al.

(10) Patent No.: US 6,459,472 B1
(45) Date of Patent: Oct. 1, 2002

(54) LITHOGRAPHIC DEVICE

(75) Inventors: Pieter Willem Herman De Jager; Henri Gerard Cato Werij, both of Rotterdam; Peter Van Zuylen, Nootdorp, all of (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/302,850

(22) Filed: Apr. 30, 1999

(30) Foreign Application Priority Data

May 15, 1998 (EP) .............................. 98201634

(51) Int. Cl.⁷ ..................... G03B 27/74; G03B 27/52
(52) U.S. Cl. ............................... 355/68; 355/30
(58) Field of Search ....................... 355/53, 55, 30, 355/67–71, 77; 250/492.2, 492.22; 378/34

(56) References Cited

U.S. PATENT DOCUMENTS

| | | | |
|---|---|---|---|
| 4,648,106 A | 3/1987 | Novak | 378/34 |
| 4,690,528 A * | 9/1987 | Tanimoto et al. | 353/101 |
| 4,692,934 A | 9/1987 | Forsyth | 378/34 |
| 5,063,586 A | 11/1991 | Jewell et al. | 378/34 |
| 5,153,898 A | 10/1992 | Suzuki et al. | 378/34 |
| 5,212,588 A | 5/1993 | Viswanathan et al. | 378/34 |
| 5,305,364 A * | 4/1994 | Mochiji et al. | 378/34 |
| 5,315,629 A | 5/1994 | Jewell et al. | 378/34 |
| 5,353,323 A | 10/1994 | Hirokawa et al. | 378/34 |
| 5,715,089 A | 2/1998 | Shiraishi | 359/558 |
| 5,821,175 A | 10/1998 | Engelsberg | 438/795 |

FOREIGN PATENT DOCUMENTS

| | | |
|---|---|---|
| EP | 0 252 734 A2 | 1/1988 |
| EP | 0 532 968 A1 | 3/1993 |
| EP | 0 532 968 | 3/1993 |

* cited by examiner

*Primary Examiner*—Russell Adams
*Assistant Examiner*—Hung Henry Nguyen
(74) *Attorney, Agent, or Firm*—Pillsbury Winthrop LLP

(57) ABSTRACT

A lithographic device has a radiation system for supplying a projection beam of radiation; a mask table provided with a mask holder for holding a mask; a substrate table provided with a substrate holder for holding a substrate; and a projection system for imaging an irradiated portion of the mask onto a target portion of the substrate. The projection system is separated from the table by an intervening space which can be at least partially evacuated and which is delimited at the location of the projection system by a mirror from which the employed radiation is directed toward the substrate table. The intervening space contains a hollow tube located between the solid surface and the substrate table and situated around the path of radiation, the form and size of the tube being such that radiation focused by the de Jager et al. projection system onto the substrate table does not intercept a wall of the hollow tube. A gas flushing unit is provided for continually flushing the inside of the hollow tube with a flow of gas.

18 Claims, 2 Drawing Sheets

LITHOGRAPHIC DEVICE

BACKGROUND OF THE INVENTION

1. Field of the Invention

The invention relates to a lithographic projection apparatus, and more particularly to a lithographic projection apparatus that is compatible with a vacuum or semi-vacuum environment.

2. Discussion of Related Art

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since the projection system will have a magnification factor M (generally<1), the speed v at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such a multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine In currently available lithographic devices, the employed radiation is generally ultra-violet (UV) light, which can be derived from an excimer laser or mercury lamp, for example; many such devices use UV light having a wavelength of 365 nm or 248 nm. However, the rapidly developing electronics industry continually demands lithographic devices which can achieve ever-higher resolutions, and this is forcing the industry toward even shorter-wavelength radiation, particularly UV light with a wavelength of 193 nm or 157 nm. Beyond this point there are several possible scenarios, including the use of extreme UV light (EUV: wavelength~50 nm and less, e.g. 13.4 nm or 11 nm), X-rays, ion beams or electron beams. All of these so-called next-generation radiations undergo absorption in air, so that it becomes necessary to at least partially evacuate the environment in which they are employed. This introduces considerable problems.

A general discussion of the use of EUV in lithographic projection apparatus can be found, for example, in the article by J. B. Murphy et al. in Applied Optics 32 (24), pp 6920–6929 (1993). Similar discussions with regard to electron-beam lithography can be found in U.S. Pat. No. 5,079,112 and U.S. Pat. No. 5,260,151, as well as in EP-A 98201997.8 (P-0113.000-EP).

SUMMARY OF THE INVENTION

It is an object of the invention to provide a lithographic projection apparatus as stated in the opening paragraph, which apparatus is compatible for use in a vacuum or semi-vacuum environment. In particular, it is an object of the invention that such an apparatus should be compatible with the use of radiation comprising EUV, charged particles or X-rays. More specifically, it is an object of the invention that such an apparatus should not suffer from significant "down-time" due to decrease of operational performance caused by degeneration of the projection system.

These and other objects are achieved in a lithographic projection apparatus that has a radiation system for supplying a projection beam of radiation; a mask table for holding a mask; a substrate table for holding a substrate; and a projection system for imaging an irradiated portion of the mask onto a target portion of the substrate. Preferably, the lithographic projection apparatus according to the invention has the following characteristics;

a) the projection system is separated from the substrate table by an intervening space which can be at least partially evacuated and which is delimited at the location of the projection system by a solid surface from which the employed radiation is directed toward the substrate table;

b) the intervening space contains a hollow tube located between the solid surface and the substrate table and situated around the path of the radiation, the form and size of the tube being such that radiation focused by the projection system onto the substrate table does not intercept a wall of the hollow tube;

c) means are provided for continually flushing the inside of the hollow tube with a flow of gas.

The "solid surface" referred to under point (a) is, for example, the final mirror in the projection system from which the radiation is directed toward the substrate, or a (thin) optical flat (i.e. optical window) comprised of a vitreous material. The term vitreous should here be interpreted as encompassing such materials as silicates, quartz, various transparent oxides and fluorides (such as magnesium fluoride, for example) and other refractories.

In experiments leading to the invention, the inventors built a prototype device in which the radiation system delivered EUV (with a wavelength of approx. 13.4 nm). A projection system (comprising various mirrors) was used to focus the laser radiation onto a substrate table, onto which a test wafer could be mounted. A substantially evacuated enclosure, delimited (bounded) at one end by the exit aperture of the laser and at the other end by the substrate table, was provided around the projection system, so that the path of the radiation from source to substrate was substantially airless, including therefore the intervening space between the projection system and the substrate table. This intervening space was delimited on the side facing the substrate table by the last mirror in the projection system (the "solid surface" referred to hereabove). Such evacuation was necessary because of the fact that EUV undergoes significant absorption in air, and was aimed at avoiding substantial light-loss at substrate level.

In working with this prototype system, the inventors observed rapid degeneration of the resolution and definition of fine (submicron-sized) images projected onto a resist-coated wafer on the substrate table. Many different possible sources of this problem were sought and investigated before the inventors finally observed that the final optical surface (mirror) in the projection system had become unacceptably contaminated. Further analysis demonstrated that this contamination was caused by the presence of a spurious coating of organic material, which was subsequently identified as consisting of debris and bye-products from the resist layer on the wafer. Evidently, such material was being "sputtered" loose from the wafer by the EUV beam, and the evacuated intervening space between the wafer and the projection system allowed the released material to migrate toward the projection system (and other vicinal surfaces) without undergoings substantial scattering or deflection. Once arrived at the projection system, the material was adsorbed onto the highly accurate optical surfaces of the system, causing the said optical surface degradation.

In an effort to combat this problem, the inventors increased the distance between the substrate table and the projection system, but rapid contamination of the final optical surface of the projection system was still observed. Subsequent calculations (see Embodiment 1 below) revealed that such an approach was in fact doomed to be unsatisfactory, and that a more radical anti-contamination measure was required. Eventually, after trying various other approaches, the inventors arrived at the solution described in steps (b) and (c) above. In the inventive solution, the flush of gas prevents resist debris from reaching the projection system in the first place.

The gas employed in the flush should be a substance which does not substantially absorb the radiation in the projection beam (e.g. EUV), while having a substantially low diffusion coefficient for contaminants. An example of such a gas is Ar; an alternative is Kr, for example.

A particular embodiment of the apparatus according to the invention is characterized in that the hollow tube has the form of a cone which tapers inwards in a direction extending from the said solid surface towards the substrate table. Seeing as the projection system serves to focus an image onto the substrate, the radiation emerging from the projection system will taper inwards toward the final image on the wafer. If the employed hollow tube is of a conical form which imitates this said tapering, then the tube will have the minimal volume necessary to encapsulate the said emergent radiation. This is advantageous, since it minimizes the flow of gas required to produce an effective flush, leading to materials savings; in addition, the gas load to the system is reduced.

Another embodiment of the apparatus according to the invention is characterized in that the gas is introduced into the hollow tube via at least one opening in a wall of the tube. Alternatively, the gas can, for example, be introduced over a top rim of the tube. In a particular version of the former embodiment, the opening is a region which is porous to the employed gas.

Another embodiment of the apparatus according to the invention is characterized in that the flushing means are thus embodied that the flush of gas in the hollow tube is at least partially directed towards the substrate table. The very presence of gas at all (whether static or dynamic) between the substrate and the projection system provides a scattering barrier to debris migrating from the substrate. However, if such gas is additionally moved toward the substrate, then this provides an additional safeguard against such debris reaching the projection system. It should be noted that the flush need not be directed in its entirety towards the substrate: for example, if the gas is introduced via an opening in the wall of the tube located at some point (e.g. half way) between its upper and lower limits (rims), then some of the gas can flow from the hole upwards (toward the projection system) and the rest can flow downwards (toward the substrate).

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

Although the discussion in this text concentrates somewhat on the use of EUV, it should be explicitly noted that the invention is also applicable in systems employing other radiation types. For example, in the case of a lithographic apparatus employing UV light in combination with a (partially) evacuated environment—aimed, for example, at reducing substrate contamination—the current invention combats the built-up of resist debris on the UV projection optics. Similarly, in the case of electron or ion beam lithography, the present invention combats the build-up of substrate-produced contaminants on field-lens electrodes. In all cases, the present invention also combats the migration of debris from the substrate to the mask, radiation source, etc.

BRIEF DESCRIPTION OF THE DRAWINGS

The invention and its attendant advantages will be further elucidated with the aid of exemplary Embodiments and the accompanying schematic drawings, whereby.

In the Figures, like reference symbols denote corresponding features.

DETAILED DESCRIPTION OF THE PREFERRED EMBODIMENTS

Embodiment 1

Figure 1:
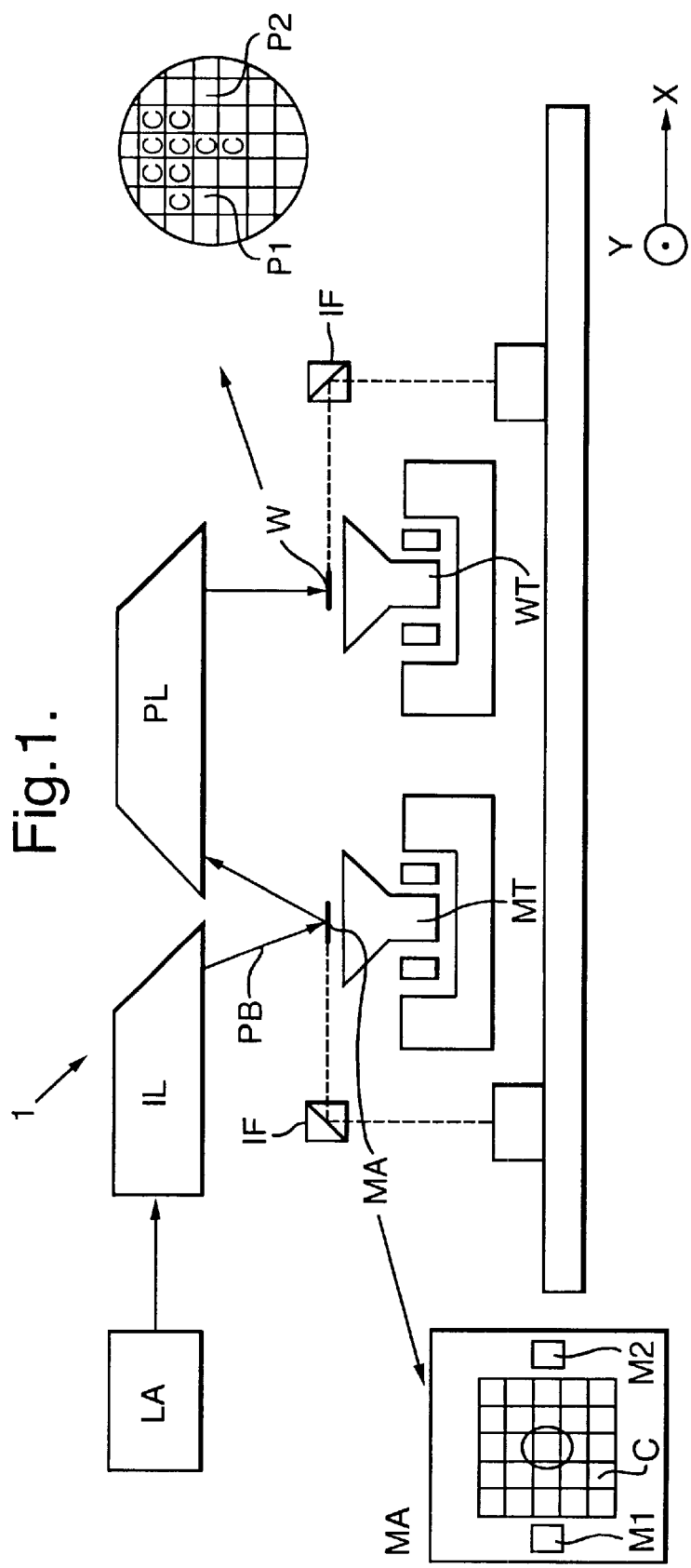
FIG. 1 renders a schematic view of a lithographic projection apparatus which is suitable for use with the current invention.

Resist contamination as hereabove described can be divided in two parts: solvents and exposure products. The solvents are necessary for spinning the resist onto the wafer, but after baking for a few hours at temperatures of the order of 160–175 ° C., for example, they will generally have evaporated. It is not very likely that complete molecules of the resist will evaporate during exposure, because the molecular mass is too high. However, it is possible that parts of the resist molecules evaporate after they have been cracked by the beam during exposure.

When resist is illuminated by energetic radiation, the long chains of resist molecules can interconnect or break depending on the type of resist used: negative or positive resist. In the case of breaking, short chains of organic material will be created, and these may evaporate from the resist. In a vacuum system, these particles can travel through the system freely and reach those optical elements of the projection system which are "visible" from the illuminated wafer, even though the distance between resist and optics can be quite large (e.g. about 0.5 meter). Carbon- and oxide-containing molecules will adsorb relatively easily onto the mirror surfaces.

The mean free path of the contamination molecules is:

$$\lambda = (k_B T)/(\sqrt{2} p \pi d^2)$$

where:

$k_B$ Boltzmann constant [$1.38 \times 10^{23}$ J/K]

T temperature of gas [e.g. 300 K]

p=pressure of background gas inside the camera [Pa]

d=effective diameter of a contamination molecule

On average, a debris molecule can reach a surface at 0.5 m without scattering if the environmental pressure is lower than $3 \times 10^{-4}$ mbar. This pressure is equal to, or even higher than, the pressure in an EUV system, so that we may assume that the debris molecules will reach the last projection-system mirror without obstruction. The contamination molecules are assumed to be emitted with a $\cos(\theta)$ angular distribution. Therefore, at least all molecules that are emitted within a solid angle the same as that of the EUV beam will reach the last mirror. For NA (numeric aperture)=0.1, this fraction of the total yield is:

$$1/\pi \int_0^{2\pi} \int_0^{\alpha} \cos(\theta) \sin(\theta) d\vartheta d\phi \approx 1\%$$

where $\alpha$ is the half opening angle of the EUV beam [NA $0.1 \Rightarrow \alpha \sim 5.5°$]. A fraction of these molecules reaching the last mirror will be adsorbed. The result of this adsorption can be a decrease of the mirror's reflectivity and/or a degradation of its surface smoothness, which results in enhanced scattering of the EUV light.

The Total Integrated Scatter (TIS) is of the order of $(4\pi\sigma/\lambda^2)$, where $\sigma$ is the RMS surface roughness and $\lambda$ the wavelength of the incident light. Allowing a TIS due to surface roughness of the order of 1%, we obtain a maximum acceptable RMS surface roughness of the order of 0.1 nm. In the assumption that 50% of this roughness is due to contamination adsorption, one obtains:

$$\text{contamination-induced roughness (RMS)} = 0.05 \text{ nm} = (\Sigma \Delta z^2/N)^{1/2} = \sqrt{(f \Delta z^2)}$$

where:

$\Delta z$: effective thickness of adsorbed contamination $\Sigma$: summation over particles in illuminated footprint on mirror N: number of monolayer particles in illuminated footprint on mirror f: fractional monolayer coverage In the assumption that the diameter of an adsorbed molecule is of the order of 0.25 nm (e.g. 0.23 nm for $CO_2$) it can be calculated that the maximum allowed fractional monolayer coverage is about 5%. In other words, after deposition of 0.05 monolayer of contamination, the optics do not comply with roughness requirements anymore. This implies a permitted maximum of $10^{14}$ adsorbed debris molecules/$cm^2$ inside the EUV footprint of the beam on the last mirror of a projection system (e.g. a "Jewell-type" projection system as described in U.S. Pat. No. 5,063,568).

In order to calculate the time it takes before the maximum allowed debris layer is deposited onto the exposed mirror, one has to know the flux of debris due to the 13.4 nm bombardment. The photodesorption yield of neutrals emitted after irradiation by EUV with $\lambda$=13.4 nm EUV (92.7 eV) or 11 nm (109 eV) can be estimated from measurements of the yield after impact of 4.9 eV photons (254 nm radiation) or 25 eV electrons [see G. Hiraoka, IBM Journal of Research and Development, 1977, pp 121–130]. This is done assuming that the yield over this small energy range scales purely with excitation energy and is independent of the type of excitation [G. D. Kubiak et al., J. Vac. Sci. Technol. B 10(6), 1992, pp 2593–2599]. From the data presented in Table 1 (obtained from the above-mentioned Hiraoka article) we infer that, for PMMA resist, of the order of one hydrocarbon molecule (disregarding the $CO_2$ production) is released per incident photon of 100 eV. If we assume a PMMA sensitivity to 13.4-nm radiation of 75 mJ/$cm^2$, we find from the tabulated data that the total photodesorption yield per exposure with EUV radiation is of the order of $5 \times 10^{15}$ molecules/cm for PMMA. For AZ.PN 114 resist, this should be two orders of magnitude less. Dedicated EUV resists are being developed by several manufacturers. Outgassing to some degree is expected.

If 40% of the area of a 300 mm wafer is exposed, the produced hydrocarbon amount is of the order of 1018 molecules/wafer for PMMA and $10^{16}$ molecules/wafer for AZ.PN 114. Above, it has already been shown that 1% of these hydrocarbon molecules retraces the optical path and coats the last mirror. The footprint on the last mirror is ~$100^2$ cm, which implies that, per illuminated wafer using PMMA resist, $10^{14}$ debris molecules/$cm^2$ will hit the exposed mirror. In other words, assuming all molecules stick, after exposure of only one wafer the debris coverage of the last mirror already exceeds the maximum allowed value.

TABLE 1

Contamination from PMMA resist due to radiation and electron bombardment

| Product | quantum efficiency (%) of UV photolysis at 254 nm and T = 297K | yield for 25-eV electron beam exposure [molec./100 eV] |
|---|---|---|
| $H_2$ | 0.3 | not measured |
| $CH_3^\bullet + CH_4$ | 0.8 | not measured |
| CO | 0.7 | not measured |
| CHO | not measured | not measured |
| $CH_3O^\bullet + CH_3OH$ | 0.9 | 0.01 |
| $CH_3CH = CH_2$ | none | 0.08 |
| $CO_2$ | 0.8 | 0.18 |
| $(CH3)_2C = CH_2$ | none | 0.08 |
| $HCOOCH_3$ | none | 0.004 |
| $(CH_3)_2CHCO_2CH_3$ | none | 0.02 |
| $(CH_3)_3CO_2CH_3$ | none | 0.01 |
| $CH_3C(= CH_2)CO_2CH_3$ | not measured | 0.22 |
| $M^n/M^n_o$* | not measured | 0.79 |

*Monomeric compounds such as methyl methacrylate, methyl pivalate, and methyl isobutyrate.

Although the above calculation is only a rough approximation, it is clear that the demonstrated contamination cannot be tolerated. Therefore it is important to find methods to increase the lifetime of the optical elements.

Embodiment 2

Table 2 relates to the use of a gas flush according to the invention, and shows calculated pressure distributions and contamination distributions for various amounts and positions of gas introduction. The background pressure is 2.5 Pa. The gas loads are given per steradian; therefore, the actual gas load on the system is $2\pi$ larger.

TABLE 2

Suppression of debris due to gas flow in tube.

| gas load [mbar.l/s] | introduction height above wafer [cm] | Suppression factor of debris (fraction debris in buffer gas) |
|---|---|---|
| 3.17 | 3 | $10^{-8}$ |
| 5.34 | 3 | $<10^{-12}$ |
| 6.97 | 3 | $<10^{-12}$ |
| 3.25 | 6 | $10^{-4}$ |
| 5.65 | 6 | $10^{-8}$ |
| 6.98 | 6 | $10^{-10}$ |

The above figures were obtained using Computer Fluid Dynamics calculations. The lowest background pressure in these calculations to ensure reliable results is 2.5 Pa. However, in an actual system the pressure may be lower.

The efficiency and the gas path both increase with increasing height of gas introduction above the wafer, for constant gas pressure at the entrance position. This is because, in general, only gas flowing toward the wafer is sufficiently effective in preventing debris from entering the (vacuum) enclosure in which the projection system is located, and such prevention occurs over a larger distance when the gas is introduced at a higher position. The change of absorption resulting from the change of gas path is not very significant. The absorption is less than 10% for all but the highest introduction points.

A reasonable result is achieved for 35 Pa gas pressure at an introduction point which is about 50 mm above the wafer, corresponding to 30 mm into the tube, since a final distance between the wafer and the bottom of the tube of 20 mm is assumed. At that working point, a debris suppression efficiency of $10^{11}$ is possible (increasing the average time-lapse between having to clean the optics by four orders of magnitude, or more) with only 9% EUV light absorption.

Embodiment 3

FIG. 1 renders a schematic perspective view of a lithographic projection apparatus suitable for use with the current invention. The apparatus comprises:

a radiation system LA, IL for supplying a projection beam PB of radiation (e.g. EUV light with a wavelength in the range 10–15 nm, or a flux of electrons, ions or X-rays);

a mask table MT, for holding and positioning a mask MA (e.g. a reticle);

a substrate table WT, for holding and positioning a substrate W (e.g. a resist-coated silicon wafer);

a projection system PL (e.g. a reflective system (mirror group) or a field lens) for imaging an irradiated portion of the mask MA onto a target portion C (die) of the substrate W.

The radiation system comprises a source LA (e.g. a synchrotron, undulator or laser, or a charged particle or X-ray source) which produces a beam of radiation. This beam is passed through the beam shaping system IL, so that the resultant beam PB is substantially collimated and uniformly intense throughout its cross-section.

The beam PB subsequently intercepts the mask MA which is held in a mask holder on a mask table MT. From the mask MA, the beam PB passes through the projection system PL, which focuses the beam PB onto a target area C of the substrate W. With the aid of the interferometric displacement and measuring means IF, the substrate table WT can be moved accurately, e.g. so as to position different target areas C in the path of the beam PB.

The depicted apparatus can be used in two different modes:

In step mode, the mask table MT is fixed, and an entire mask image is projected in one go (i.e. a single "flash") onto a target area C. The substrate table WT is then shifted in the x and/or y directions so that a different target area C can be irradiated by the (stationary) beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the projection system PL (e.g. M=1/4 or 1/5). In this manner, a relatively large target area C can be exposed, without having to compromise on resolution.

Although only one substrate table WT is depicted in FIG. 1, there may at least one other substrate table, which moves in the same plane as the first substrate table WT.

If the projection beam PB comprises radiation such as EUV, charged particles or X-rays, it will generally be necessary to at least partially evacuate the depicted apparatus, at least along the path of the beam PB from the source LA to the wafer W. Such evacuation has the disadvantage that it allows the migration of resist debris from the wafer W over relatively long distances, and particularly into the projection system PL, whence such debris can accumulate on optical surfaces (e.g. mirrors) and cause serious degradation of their quality. This problem can be tackled using the current invention, for example as described in the following embodiment.

Embodiment 4

Figure 2:
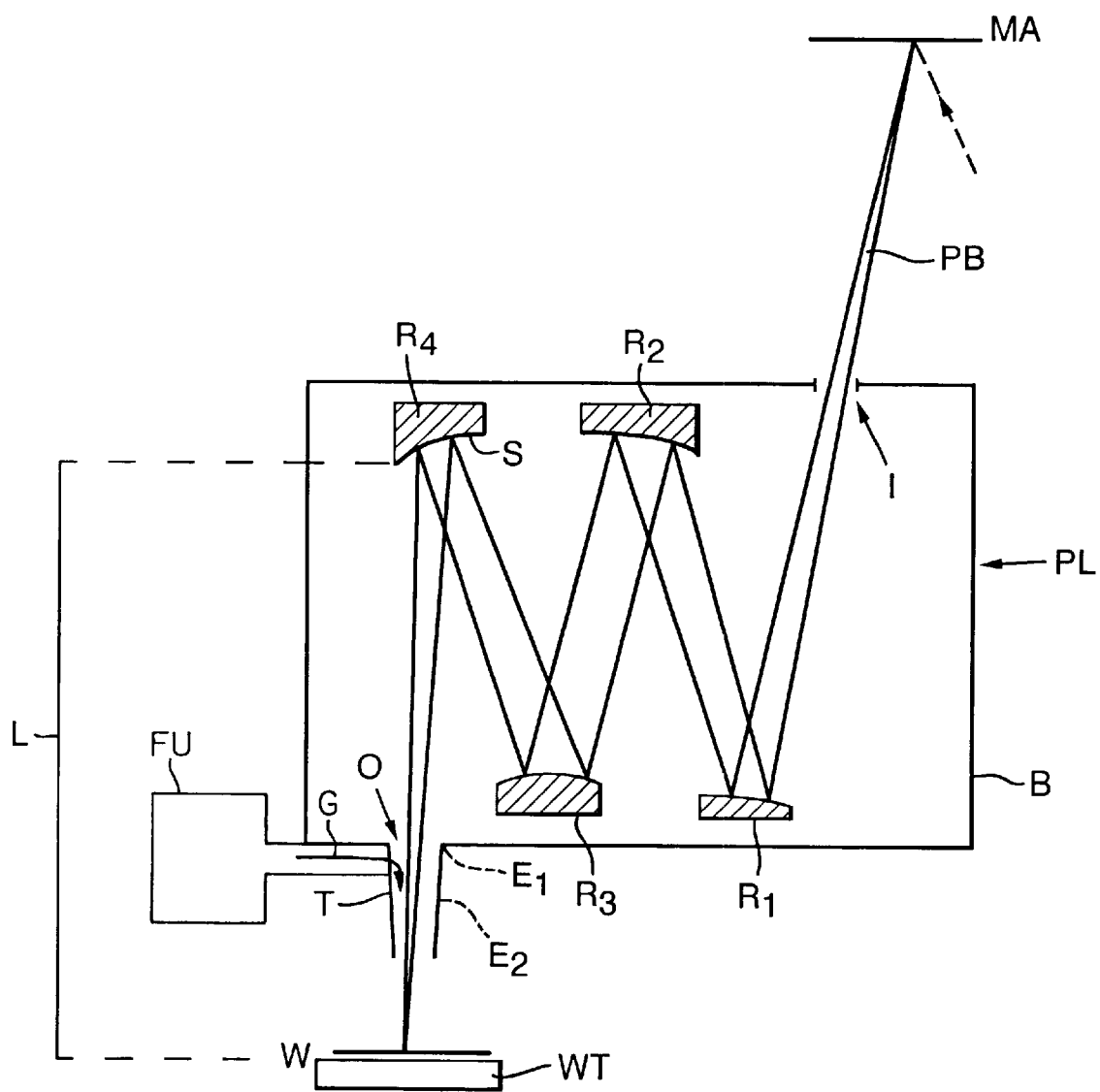
FIG. 2 shows a cross-sectional view of part of an apparatus as depicted in FIG. 1, and demonstrates how the current invention can be used according to a particular embodiment.

FIG. 2 shows part of an apparatus as depicted in FIG. 1, and demonstrates how the current invention can be applied therein.

The projection beam PB coming (e.g. reflected) from the mask MA passes through the projection system PL before impinging on the substrate W located on the substrate table WT. In this case, the projection system PL comprises four reflectors (mirrors) $R_1$, $R_2$, $R_3$, $R_4$, which serve to focus the beam PB according to given specifications. In this particular instance, the projection system PL is located in an enclosure B, which is provided with an entrance aperture I and an exit aperture 0 to allow entrance and exit of the beam PB. Although the presence of the enclosure B helps to prevent the accumulation of resist debris on the surfaces of the mirrors $R_1$–$R_4$, it is still possible for reduced quantities of such debris to reach these mirrors, e.g. via the aperture O.

The projection system PL is separated from the substrate table WT by an intervening space L. This space L is delimited at the location of the projection system PL by the solid reflecting surface S of the "final" mirror $R_4$ in the system PL. It is noted that it is from the mirror $R_4$ that radiation is finally directed toward the substrate W.

The space L contains a hollow tube T which is positioned around the path of the radiation beam PB on its way from the surface S to the substrate table WT. This tube T is thus formed, sized and positioned that its walls do not intercept the beam PB. In this particular case, the tube T is embodied as a continuation of the enclosure B, projecting outward from the exit aperture O. Moreover, as here depicted, the tube T tapers in the direction of the substrate table WT.

According to the invention, the tube T contains a gas which does not substantially absorb EUV, e.g., Ar or Kr. Preferably, this gas is flushed through the tube T in the direction of the substrate W. This can be achieved, for example, by using a flushing unit FU to introduce a downward flow of the gas G into the tube T in proximity to its top rim ($E_1$) or at some point ($E_2$) between its top and bottom rims; in the case of introduction at such a latter intermediate point ($E_2$), part of the flow may be downward and part may be upward, for example.

We claim:

1. A lithographic projection apparatus, comprising:
   a radiation system constructed and arranged to supply a projection beam of radiation;
   a mask table;
   a substrate table;
   a projection system constructed and arranged to image an irradiated portion of a mask held by said mask table onto a target portion of a substrate held by said substrate table,
   wherein the projection system is separated from the substrate table by an intervening space which can be at least partially evacuated and which is delimited by a mirror in the projection system, the employed radiation being directed from the mirror toward the substrate table, the intervening space contains a hollow tube located between the mirror and the substrate table and situated around a path of the radiation, a form and size of the tube being such that radiation focused by the projection system onto the substrate table does not intercept a wall of the hollow tube; and
   a flushing unit constructed and arranged to continually flush an inside region defined by the hollow tube with a flow of gas.

2. An apparatus according to claim 1, wherein the hollow tube has the form of a cone which tapers inwards in a direction extending from the mirror towards the substrate table.

3. An apparatus according to claim 1, wherein the gas is introduced into the hollow tube via at least one opening in a wall of the tube.

4. An apparatus according to claim 3, wherein the opening is a region of the wall which is porous to the employed gas.

5. An apparatus according to claim 1, wherein the flushing unit flushes gas in the hollow tube at least partially directed towards the substrate table.

6. A device manufacturing method, comprising:
   projecting an image of at least part of a mask pattern on a mask onto a target area of the layer of radiation-sensitive material on a substrate using a projection beam of radiation,
   wherein said projecting is done with a projection system that is at least partially contained in an enclosure which can be at least partially evacuated and which is delimited by a mirror in the projection system, said enclosure defining a hollow tube, the form and size of the tube being such that radiation focused by the projection system onto the substrate table does not intercept a wall of the hollow tube; and
   continually flushing the inside of the hollow tube with a flow of gas.

7. A device manufactured by the method of claim 6.

8. An apparatus according to claim 2, wherein the gas is introduced into the hollow tube via at least one opening in a wall of the tube.

9. An apparatus according to claim 8, wherein the opening is a region of the wall which is porous to the employed gas.

10. An apparatus according to claim 2, wherein the flushing unit flushes gas in the hollow tube at least partially directed towards the substrate table.

11. An apparatus according to claim 3, wherein the flushing unit flushes gas in the hollow tube at least partially directed towards the substrate table.

12. An apparatus according to claim 8, wherein the flushing unit flushes gas in the hollow tube at least partially directed towards the substrate table.

13. An apparatus according to claim 4, wherein the flushing unit flushes gas in the hollow tube at least partially directed towards the substrate table.

14. An apparatus according to claim 9, wherein the flushing unit flushes gas in the hollow tube at least partially directed towards the substrate table.

15. An apparatus according to claim 1, wherein the projection system is contained in an enclosure having an exit aperture.

16. An apparatus according to claim 15, wherein the hollow tube is incorporated in the enclosure around the exit aperture.

17. An apparatus according to claim 15, wherein the hollow tube is a continuation of the enclosure projecting outward from the exit aperture.

18. A lithographic projection apparatus, comprising:
   a radiation system constructed and arranged to supply a projection beam of radiation;

a mask table;

a substrate table;

a projection system constructed and arranged to image an irradiated portion of a mask held by said mask table onto a target portion of a substrate held by said substrate table, wherein the projection system comprises an enclosure defining a hollow tube, said hollow tube defining an exit aperture and adapted to permit said projection beam of radiation to pass therethrough, a form and size of the tube being such that radiation focused by the projection system onto the substrate table does not intercept a wall of the hollow tube; and a flushing unit coupled to said enclosure and adapted to continually flush an inside region defined by the hollow tube with a flow of gas.

* * * * *

UNITED STATES PATENT AND TRADEMARK OFFICE
CERTIFICATE OF CORRECTION

PATENT NO.   : 6,459,472 B1
DATED        : October 1, 2002
INVENTOR(S)  : De Jager et al.

It is certified that error appears in the above-identified patent and that said Letters Patent is hereby corrected as shown below:

Title page,
Item [57], replace the ABSTRACT, with the following:

-- [57]   ABSTRACT

A lithographic device has a radiation system for supplying a projection beam of radiation; a mask table provided with a mask holder for holding a mask; a substrate table provided with a substrate holder for holding a substrate; and a projection system for imaging an irradiated portion of the mask onto a target portion of the substrate. The projection system is separated from the table by an intervening space which can be at least partially evacuated and which is delimited at the location of the projection system by a mirror from which the employed radiation is directed toward the substrate table. The intervening space contains a hollow tube located between the solid surface and the substrate table and situated around the path of radiation, the form and size of the tube being such that radiation focused by the projection system onto the substrate table does not intercept a wall of the hollow tube. A gas flushing unit is provided for continually flushing the inside of the hollow tube with a flow of gas. --

Signed and Sealed this

First Day of April, 2003

JAMES E. ROGAN
*Director of the United States Patent and Trademark Office*